United States Patent [19]

Arai et al.

[11] Patent Number: 5,280,647
[45] Date of Patent: Jan. 18, 1994

[54] DOUBLE-BALANCED MIXER WITH TRIPLE-LAYER FILM TRANSFORMERS

[75] Inventors: Yukikazu Arai; Haruo Kosuge; Masataka Osawa, all of Yoshida, Japan

[73] Assignee: Taisei Co., Ltd., Japan

[21] Appl. No.: 704,414

[22] Filed: May 23, 1991

[30] Foreign Application Priority Data

Jun. 14, 1990 [JP] Japan ............................. 2-156497
Nov. 22, 1990 [JP] Japan ............................. 2-319271

[51] Int. Cl.$^5$ ............................................. H04B 1/26
[52] U.S. Cl. ...................................... 455/326; 455/333; 333/25
[58] Field of Search ............. 455/323–327, 333; 333/25, 26

[56] References Cited

U.S. PATENT DOCUMENTS

| | | | |
|---|---|---|---|
| 4,293,956 | 10/1981 | Alstatt | 455/327 |
| 4,755,775 | 7/1988 | Marczewski et al. | 333/26 |
| 5,003,622 | 3/1991 | Ma et al. | 455/327 |

Primary Examiner—Reinhard J. Eisenzopf
Assistant Examiner—Chi Pham
Attorney, Agent, or Firm—Lorusso & Loud

[57] ABSTRACT

A multi-layered double-balanced mixer includes first and second transformers formed as first, second and third winding film layers separated by insulating films and stacked on one side of a substrate with first and second input/output electrode pairs connected to opposite ends of the second winding layers of the respective transformers. Diode electrodes of a four diode matrix are connected to one ends of the first and third winding layers. Third input/output electrodes are connected to second ends of the first and third winding layers of the first and second transformers. A film shield covers the first and second transformers and the diode matrix. First and second adjusting stubs are formed as film structures outside of the shield and are connected to a respective input/output electrodes of said first, second and third input/output electrodes for adjusting input impedances of the double-balanced mixer.

5 Claims, 8 Drawing Sheets

DOUBLE-BALANCED MIXER WITH TRIPLE-LAYER FILM TRANSFORMERS

BACKGROUND OF THE INVENTION

1. Field of the Invention

The present invention relates generally to a double-balanced mixer, and more particularly to a double-balanced mixer which is suitable for mass production and has a stable high frequency characteristic.

2. Description of the Prior Art

A conventional double-balanced mixer used with an automobile telephone and so on, as illustrated in FIG. 9, is constructed with ferrite cores $FC_1$, $FC_2$ having a width of, e.g., 5.2 mm, a depth of, e.g., 3 mm, and a height of, e.g., 2 mm, which ferrite cores have through-holes $CH_1$, $CH_2$ 1.2 mm in diameter in which lead wires $W_1$-$W_3$, $W_4$-$W_6$ 0.15 mm in diameter are manually wound to form input/output coils LA, LB, which coils are combined with a diode matrix DM to make a circuit. In operation of the double-balanced mixer as set forth in the above, the windings of the coils LA and LB comprise primary coils $L_1$, $L_6$ and secondary coils $L_2$, $L_3$, $L_4$, $L_5$, respectively, and silver electrodes $P_5$, $P_6$, $P_7$, $P_8$ of the diode matrix DM are connected to one ends of the respective secondary coils $L_2$, $L_3$, $L_4$, $L_5$, which have second ends connected to the silver electrodes $P_2$, $P_4$, $P_9$, $P_{10}$ as intermediate leads.

These coils comprise a RF side into which a RF signal $f_1$ is input from the silver electrodes $P_1$ and $P_2$, a local side into which a local signal $f_2$ is input from the silver electrodes $P_{11}$, $P_{12}$, and an IF side from which an IF signal $f_3$ is output from the silver electrodes $P_3$, $P_4$ and $P_9$, $P_{10}$. Then it is necessary to handle carefully the coils to prevent tearing of the insulation on the lead wires and shorting out of the three windings in the through-holes $CH_1$ and $CH_2$.

Further, it is hard to mechanize the process for winding the lead wires $W_1$-$W_3$ and $W_4$-$W_6$ and the tests on completion such as visual examination and characteristic testing require many steps.

SUMMARY OF THE INVENTION

It is thus an object of the present invention to provide a double-balanced mixer which is suitable for mass production.

A further object of the present invention is to provide a double-balanced mixer which eliminates the influences of inductance by the leads to provide a stable high frequency characteristic.

A still further object of the present invention is to provide a double-balanced mixer which can compensate the mismatching of impedance by the outside circuit, which mixer can be available in wider frequency band width and which mixer has a stable high frequency characteristic.

According to the double-balanced mixer of the present invention, if a RF signal is input to a primary coil of a first transformer and a local frequency signal in input to a primary coil of a second transformer, then there is produced an intermediate frequency in response to double-balanced modulation by the RF signal of the local signal from the secondary coils of said first and second transformers.

When using a mixer having a thin film structure, a higher frequency of the local signal can be used than in the case of a thick film structure.

According to the double-balanced mixer of the present invention, the input/output transformers are formed as layered film structures producing a double-balanced mixer responsive to a weaker high frequency than is possible in the previous designs. The double-balanced mixer of the present invention can be directly attached to a high frequency transmission line as a surface package part, because of the leadless structure of the present invention. Thus, influences of inductance by the diode matrix on all leads can be removed to get a stable frequency characteristic. The double-balanced mixer of the present invention can formed on a common substrate with the other high frequency parts such as a filter element to get further improved high frequency characteristics, as a whole.

Further, since the input/output transformers are formed as layered structures, the double-balanced mixer of the present invention contributes not only to a space factor, but also to improved productivity.

Still further, if there are provided adjusting stubs outside the circuit which are shielded by the circuit shielding means, then the mismatching of the impedance by the outside circuit can be compensated to get a wide usable frequency band width and a stable high frequency characteristic.

BRIEF DESCRIPTION OF THE DRAWINGS

Illustrative and presently preferred embodiments of the invention are shown in the accompanying drawings in which.

DETAILED DESCRIPTION OF THE PREFERRED EMBODIMENTS

The presently preferred embodiments of the present invention will be explained hereinafter referring to the accompanying drawings.

Figure 1:
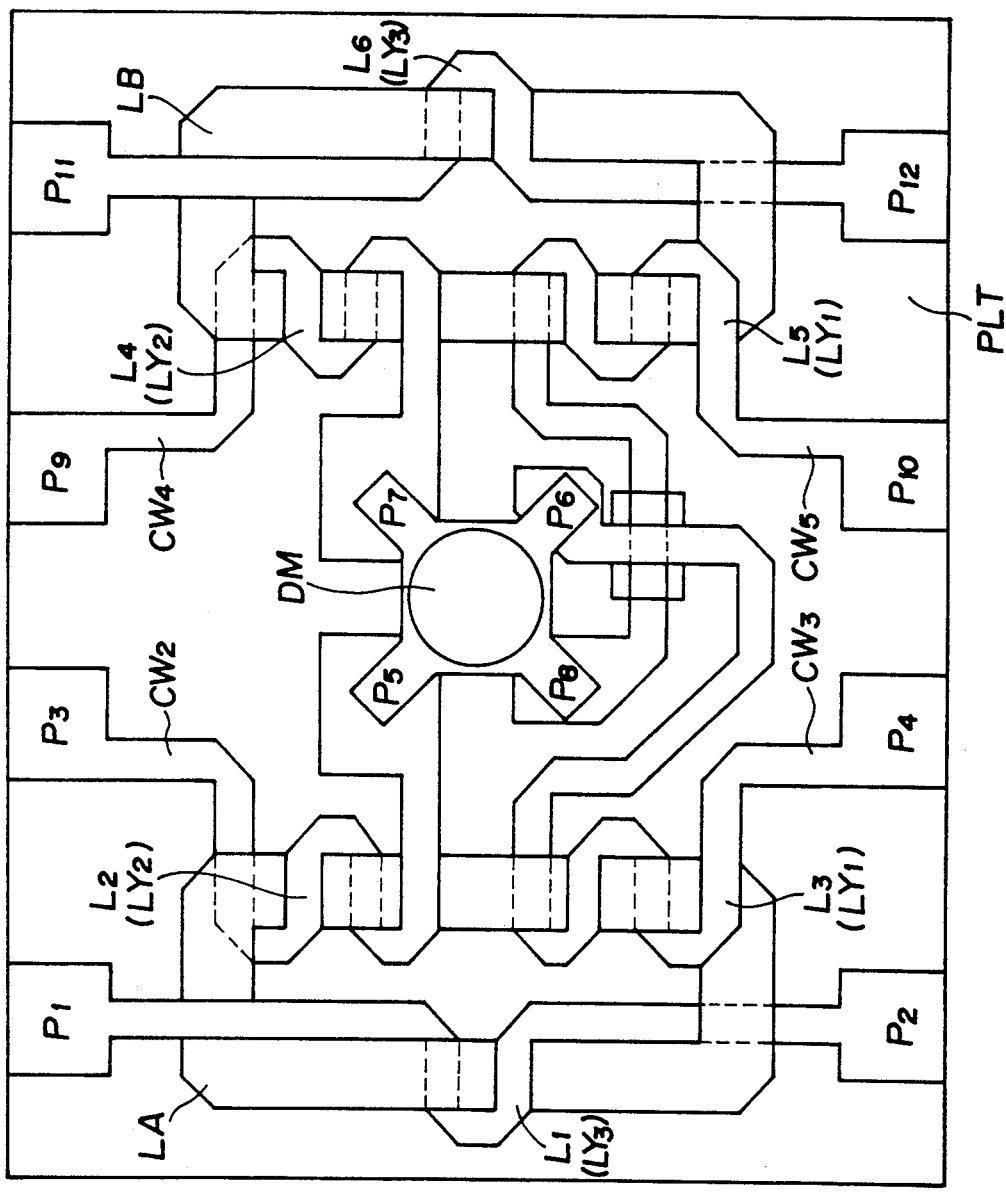
FIG. 1 is a diagram of one embodiment of the double-balanced mixer according to the present invention.
Figure 2:
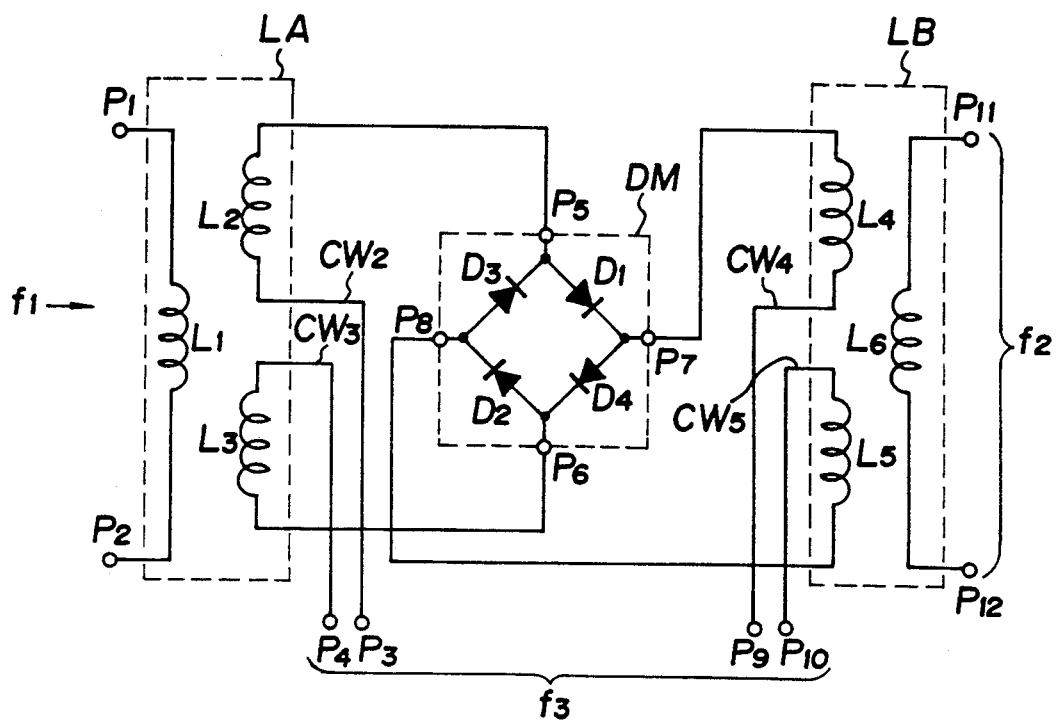
FIG. 2 is a circuit diagram for the mixer of FIG. 1.

The first embodiment of the double-balanced mixer of the present invention, as shown in FIGS. 1 and 2, comprises a first input/output transformer LA formed as a layered film structure on a substrate PLT for receiving a RF signal $f_1$ (a first signal wave) applied to a primary coil $L_1$ thereof, a second transformer LB formed as a layered film structure on said substrate PLT for receiving/providing a local frequency signal $f_2$ (a second signal wave) applied to a primary coil $L_6$ thereof, a diode matrix DM connected to one ends of secondary coils $L_2$-$L_3$ and $L_4$-$L_5$ of said first and second transformers, intermediate leads $CW_2$, $CW_3$, $CW_4$, $CW_5$ connected to second ends of the secondary coils $L_2$-$L_3$ and $L_4$-$L_5$ of said first and second input/output transformers LA, LB for receiving/providing an intermediate frequency $f_3$ (a third signal wave) from/to said diode matrix DM in response to either input or output of said second signal wave.

The primary coils $L_1$, $L_6$ and the secondary coils $L_2$-$L_3$, $L_4$-$L_5$ of each of the first and second input/output transformers LA, LB are connected to an outside circuit through silver electrodes $P_1$ and $P_2$, $P_{11}$ and $P_{12}$, $P_3$ and $P_5$, $P_6$ and $P_4$, $P_9$ and $P_7$, and $P_8$ and $P_{10}$, respectively. Further silver electrodes $P_5$, $P_6$, $P_7$ and $P_8$ of the diode matrix DM are connected to one ends of the secondary coils $L_2$-$L_3$, $L_4$-$L_5$ which, in turn, are connected to the silver electrodes $P_3$, $P_4$ and $P_9$, $P_{10}$ by the intermediate leads $CW_2$, $CW_2$, $CW_4$, $CW_5$.

Figure 3:
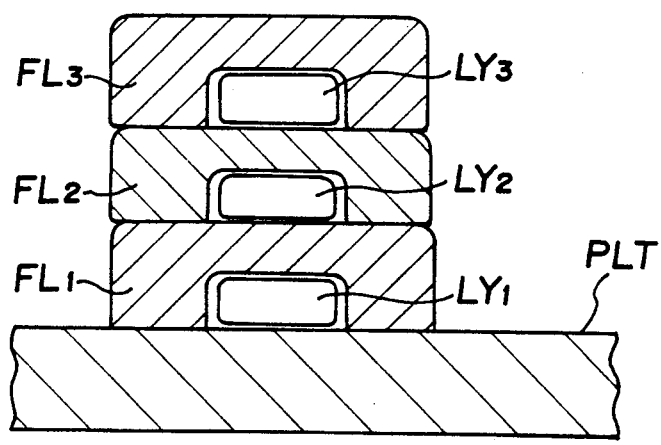
FIG. 3 is a diagram of multilayer part of the double-balanced mixer of FIG. 1.

The substrate PLT is formed by a ceramic plate having for example 0.625 mm in thickness. The conductor parts of the primary coils $L_1$, $L_6$ and the secondary coils $L_2$, $L_3$ and $L_4$, $L_5$ of the input/output transformers LA, LB and the silver electrodes $P_1$ to $P_{12}$, may be formed as multilayer structures either of thin films by sputtering or vapor-deposition of a circuit pattern on the substrate, or of thick films by screen printing of the circuit pattern on the substrate with paste such as gold, silver, silver-palladium, or copper paste. In case of the multilayer structure of thin films, the secondary coils $L_3$, $L_4$ are formed as a lower layer $LY_1$, the secondary coils $L_2$, $L_4$ are formed as a middle layer $LY_2$, and the primary coils $L_1$, $L_6$ are formed as an upper layer $LY_3$. Thus, as shown in FIG. 3, the lower, middle and upper layers $LY_1$-$LY_3$ are stacked sequentially on the substrate PLT. Insulating films $FL_1$, $FL_2$, $FL_3$ such as silicon oxide are inserted between each of the lower, middle and upper layers in order to insulate them from each other.

The ferrite cores of the input/output transformers LA, LB are formed by mixing for example, ferrite powder having 1500 a.c. initial permeability with glass powder of 10 percent by weight.

Further, in the diode matrix DM comprising non-linear elements, as shown in FIG. 2, four leads which are formed by connecting each of cathodes of the diodes $D_1$, $D_2$, $D_3$, $D_4$ with each of anodes of the diodes $D_4$, $D_3$, $D_1$, $D_2$ inside the matrix DM, are connected to the silver electrodes $P_7$, $P_8$, $P_5$, $P_6$, respectively, by a wire bonding or a heat press process. The finishing outside size is for example a width of 4.99 mm, a depth of 4.5 mm and a height of 3.0 mm.

Figure 4:
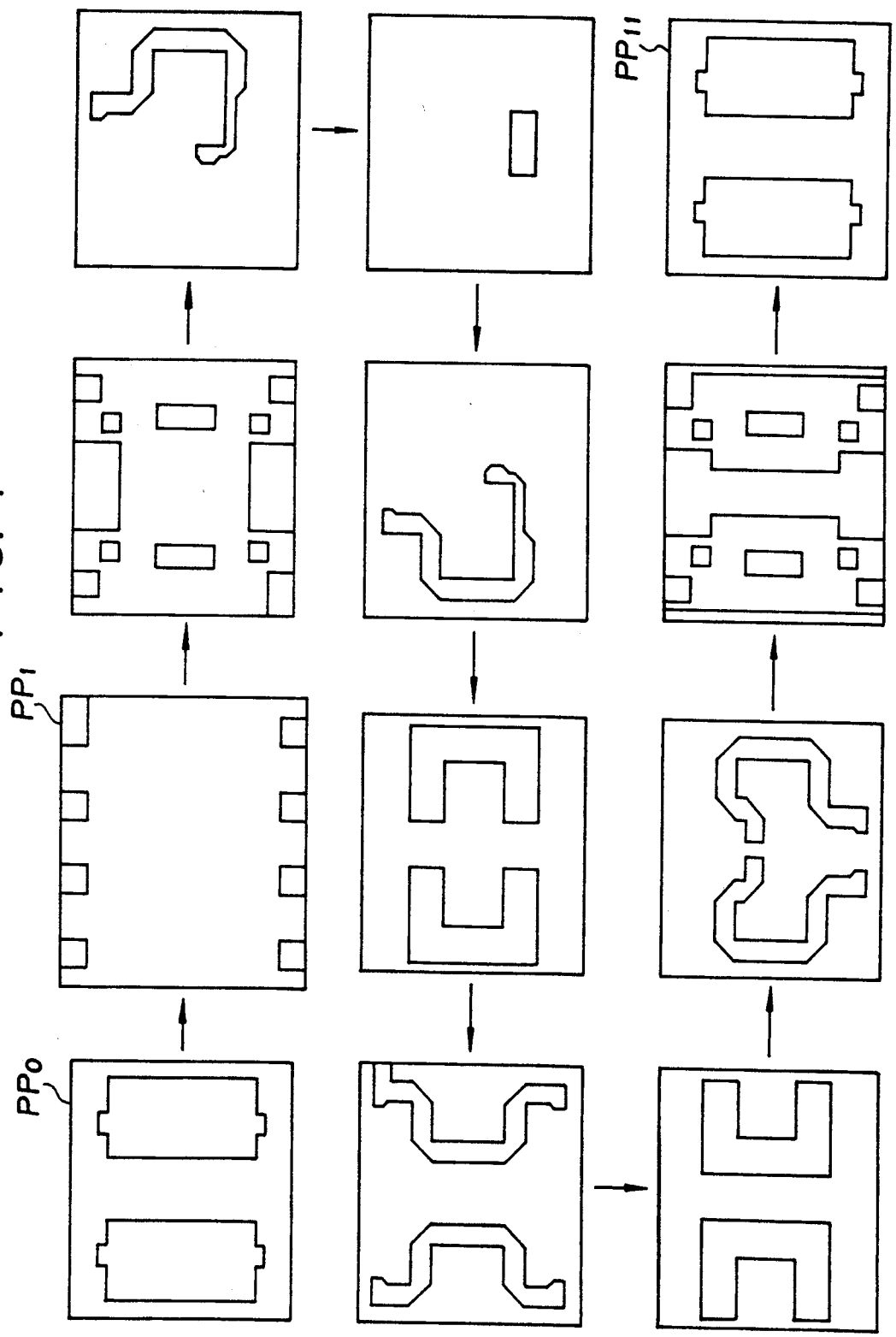
FIG. 4 is a series of diagrams illustrating patterns produced in successive steps when the double-balanced mixer of FIG. 1 is formed as a thick film structure.

FIG. 4 illustrates pattern processes $PP_0$ to $PP_{11}$ for producing the above mentioned double-balanced mixer having thick film structure.

In the double-balanced mixer being constructed according to the above mentioned processes, if 700 to 1100 MHz of RF signal $f_1$ is input to the input/output transformer LA from the silver electrodes $P_1$, $P_2$ to the primary coil $L_1$ thereof and the local signal $f_2$ is input to the input/output transformer LB from the silver electrodes $P_{11}$, $P_{12}$ to the primary coil $L_6$ thereof, then there is obtained 50 to 150 MHz of intermediate frequency $f_3$ from the silver electrodes $P_3$, $P_4$ and $P_9$, $P_{10}$ which are connected by the intermediate leads $CW_2$, $CW_3$, $CW_4$ and $CW_5$ to the secondary coils $L_2$, $L_3$, $L_4$ and $L_5$. The mixer may operate with $-40$ dB to $-60$ dB isolation of the local signal $f_2$, 200 mW of maximum input, 1 V of maximum operating voltage, 50 mA of current, and 50 ohm of impedance at each port. Further, in case of a thin film structure, the mixer may operate with 100 to 3000 MHz of RF signal and with a corresponding range of frequency of the local signal $f_2$ up to 2000 MHz higher than that of a thick film structure.

According to the double-balanced mixer of the present invention, the input/output transformers are formed as layered film structures producing a double-balanced mixer responsive to a weaker high frequency than is possible in the previous designs. The double-balanced mixer of the present invention can be directly attached to a high frequency transmission line as a surface package part, because of the leadless structure of the present invention. Thus, influences of inductance by the diode matrix on all leads can be removed to get a stable frequency characteristic. The double-balanced mixer of the present invention can formed on a common substrate with the other high frequency parts such as filter elements to get better high frequency characteristics, as a whole.

Further, since the input/output transformers are formed as a film structure, the double-balanced mixer of the present invention contributes not only to a space factor but also to improved productivity.

In the above mentioned embodiment, the RF signal $f_1$ and the local signal $f_2$ are applied to the input/output transformers LA, LB. Alternatively, the local signal can be applied to the silver electrodes $P_3$, $P_4$, $P_9$, $P_{10}$ and through the leads $CW_2$, $CW_3$, $CW_4$, $CW_5$ to the secondary coils $L_2$, $L_3$, $L_4$, $L_5$ and the modulated wave may be output from the silver leads $P_{11}$, $P_{12}$.

It must be noted that the construction and the state of the substrate, insulating material, conductor and so on are not limited to the embodiment mentioned above.

The double-balanced mixer according to the present embodiment has the advantages that it is suitable for mass production, the influences of inductance of all leads are removed, and a stable high frequency characteristic can be obtained.

Figure 5:
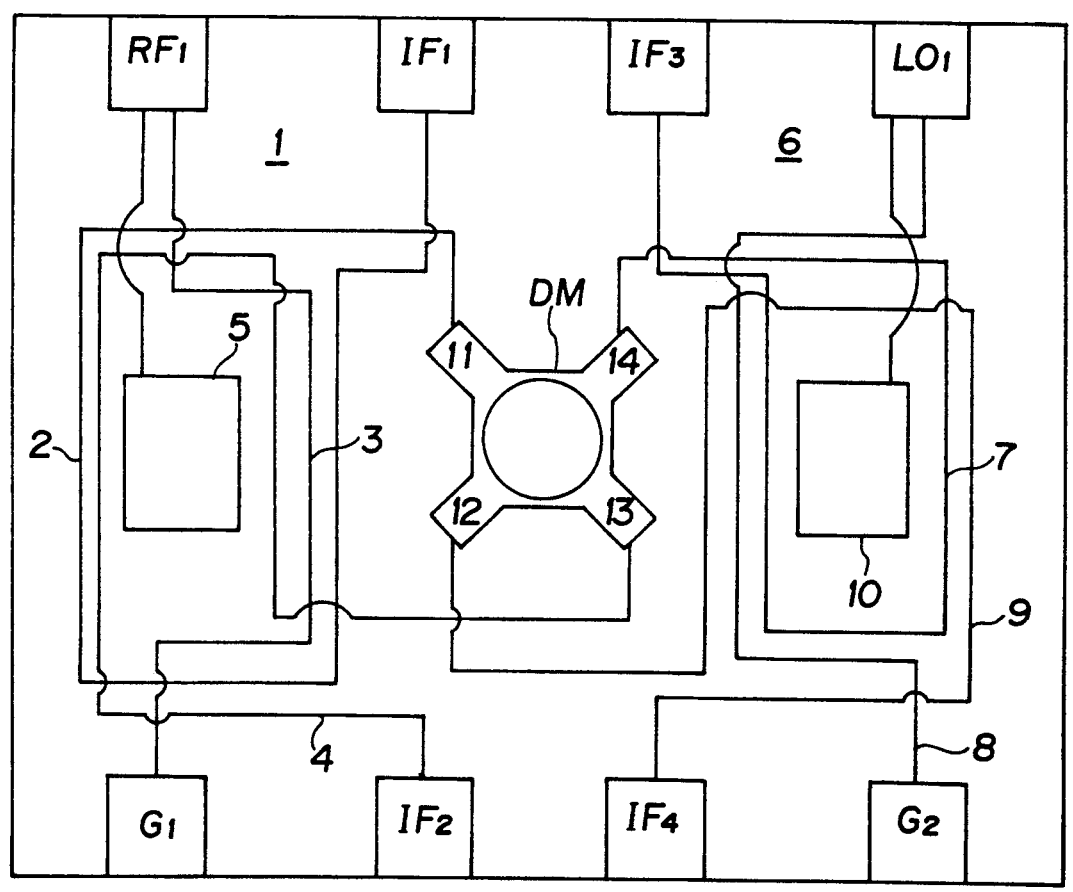
FIG. 5 is a diagram of another embodiment of the double-balanced mixer according to the present invention.

FIG. 5 illustrates another embodiment of the double-balanced mixer of the present invention. The mixer includes first and second transformers 1, 6 which are formed as thin film structures on a substrate PLT and comprise first, second and third layer windings forming a RF side transformer, first, second and third layer windings of a local side transformer, and a diode matrix DM having electrodes 11, 13, 12, 14 connected to one ends of the first and third layer windings 2 and 4, 7 and 9 of the RF side and the local side for receiving the RF and local signal waves input to the first and second transformers 1, 6 and for producing an intermediate frequency signal from the electrodes $IF_1$ and $IF_2$, $IF_3$ and $IF_4$ connected to the other ends of said first and third layer windings 2 and 4, 7 and 9.

Further, the second layer windings 3, 8 of each of the RF side and the local side transformers 1, 6 are connected to the silver electrodes $RF_1$, $G_1$, $LO_1$, $G_2$ and one ends of the first and third layer windings 2, 4, 7, 9 are connected to the silver electrodes $IF_1$, $IF_2$, $IF_3$, $IF_4$. The other ends of the windings 2, 4, 7, 9 are connected to the diode matrix DM. The adjusting stubs 5, 10 are connected to the silver electrodes $RF_1$, $LO_1$.

Figure 6:
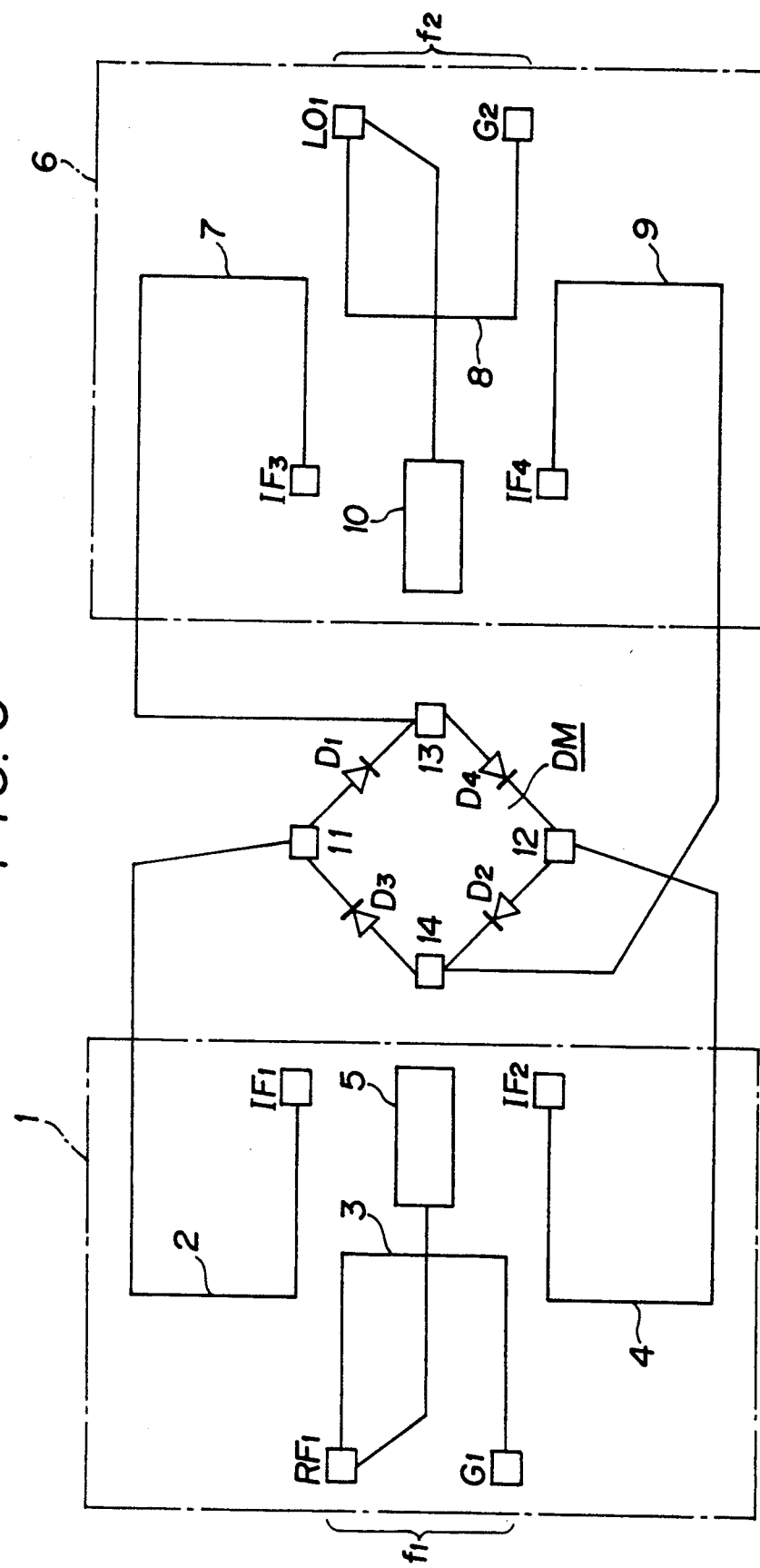
FIG. 6 is a circuit diagram for the mixer of FIG. 5.

As shown in FIG. 6, with regard to the outside circuit, the RF side is connected to the silver electrodes $RF_1$ and $G_1$, the local frequency side is connected to the silver electrodes $LO_1$ and $G_2$ and the intermediate frequency side is connected between the silver electrodes $IF_1$ and $IF_2$, $IF_3$ and $IF_4$.

Figure 7:
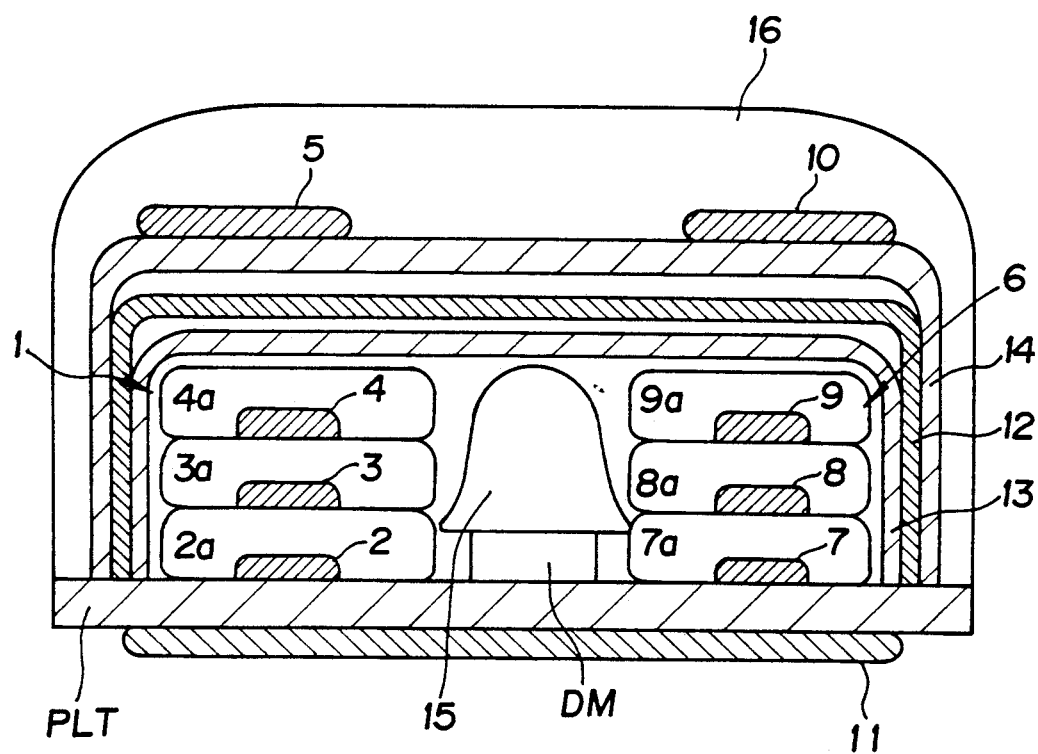
FIG. 7 is a diagram of multilayer parts of the double-balanced mixer of FIG. 5.

The circuit which includes the first and second transformers 1, 6 and the diode matrix DM is shielded by a shield 11 for the substrate bottom surface and a circuit shield 12, as shown in FIG. 7. There is provided on the circuit 12 the RF side adjusting stub 5 and the local side adjusting stub 10 for adjusting the primary impedance of the first and second transformers.

The first, second and third layer windings 2, 3, 4 and 7, 8, 9 of the first and second transformers are sequentially stacked from the lower layer by printing conductor layers. Processes for sequentially printing insulating material 2a, 3a, 4a, and 9a, 8a and 7a and drying them are performed between each process for printing the conductor layer to insulate each of the layer windings from each other. A potting 15 is performed on the center diode matrix DM, a first under-coat 13 is printed and hardened thereon and a circuit shield 12 is also printed and hardened thereon. Then a second under-coat 14 is printed and hardened on the circuit shield layer 12; the RF side adjusting stub 5 and the local side adjusting stub 10 are provided thereon; and all of the layers are covered by an insulating layer 16.

The substrate PLT comprises for example 96% alumina and curing agent, and each of the silver electrodes $P_1$ to $P_{12}$ may be formed as a multilayer structure either of thin films by sputtering or vapor-deposition of a circuit pattern on the substrate, or of thick films by screen printing of the circuit pattern thereon with paste such as gold, silver, silver-palladium, or copper paste. The gold paste is used for the transmitting line of each part and each insulating layer is formed by using glass powder having 30 to 40 μm in thickness. Further, weight ratio of glass powder to the hardened material is 100:6, and the shield material and the stub are formed by using a copper paste of a phenol group.

Figure 8:
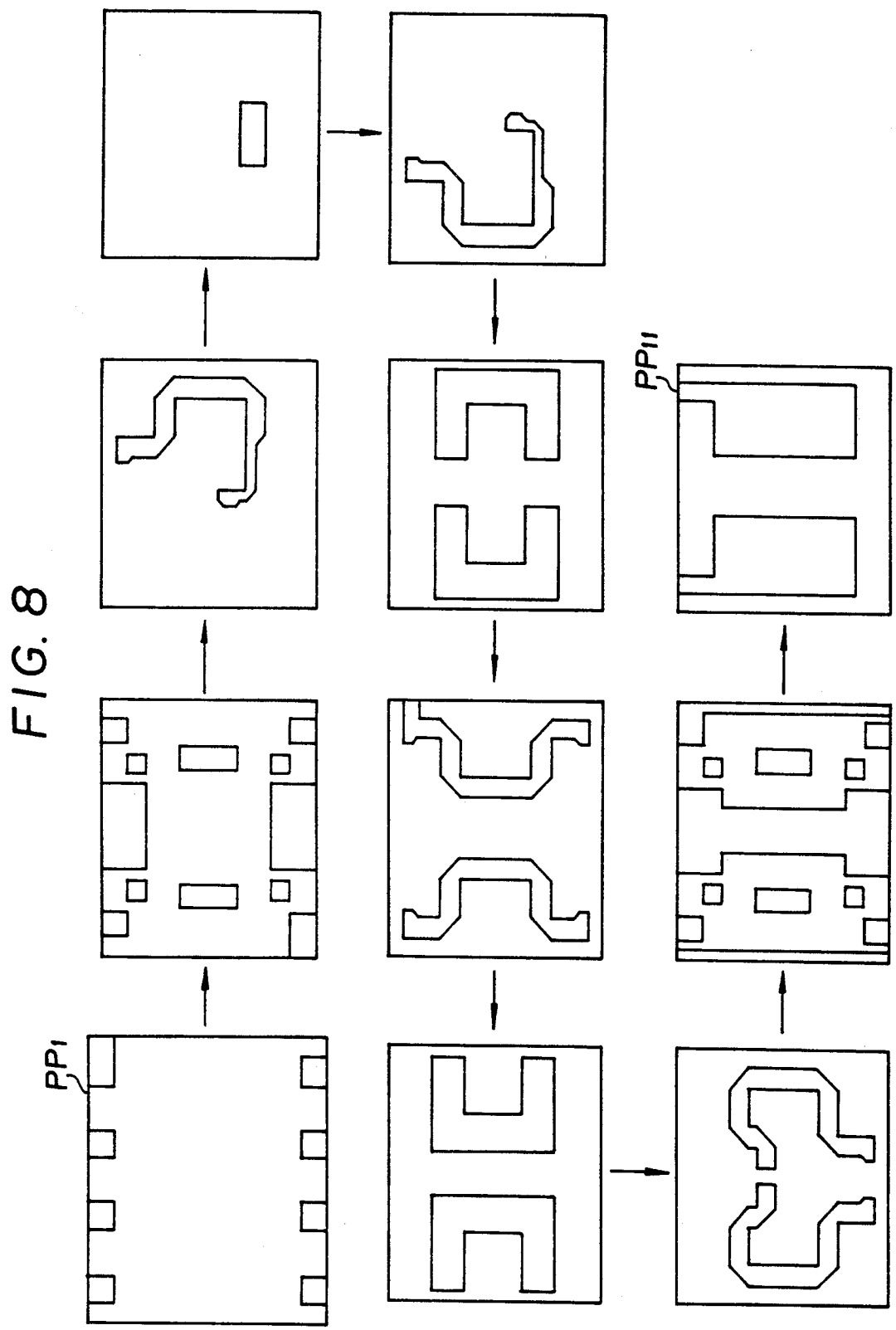
FIG. 8 is a series of diagrams illustrating patterns produced in successive steps when the double-balanced mixer of FIG. 5 is formed as a thick film structure.
Figure 9:
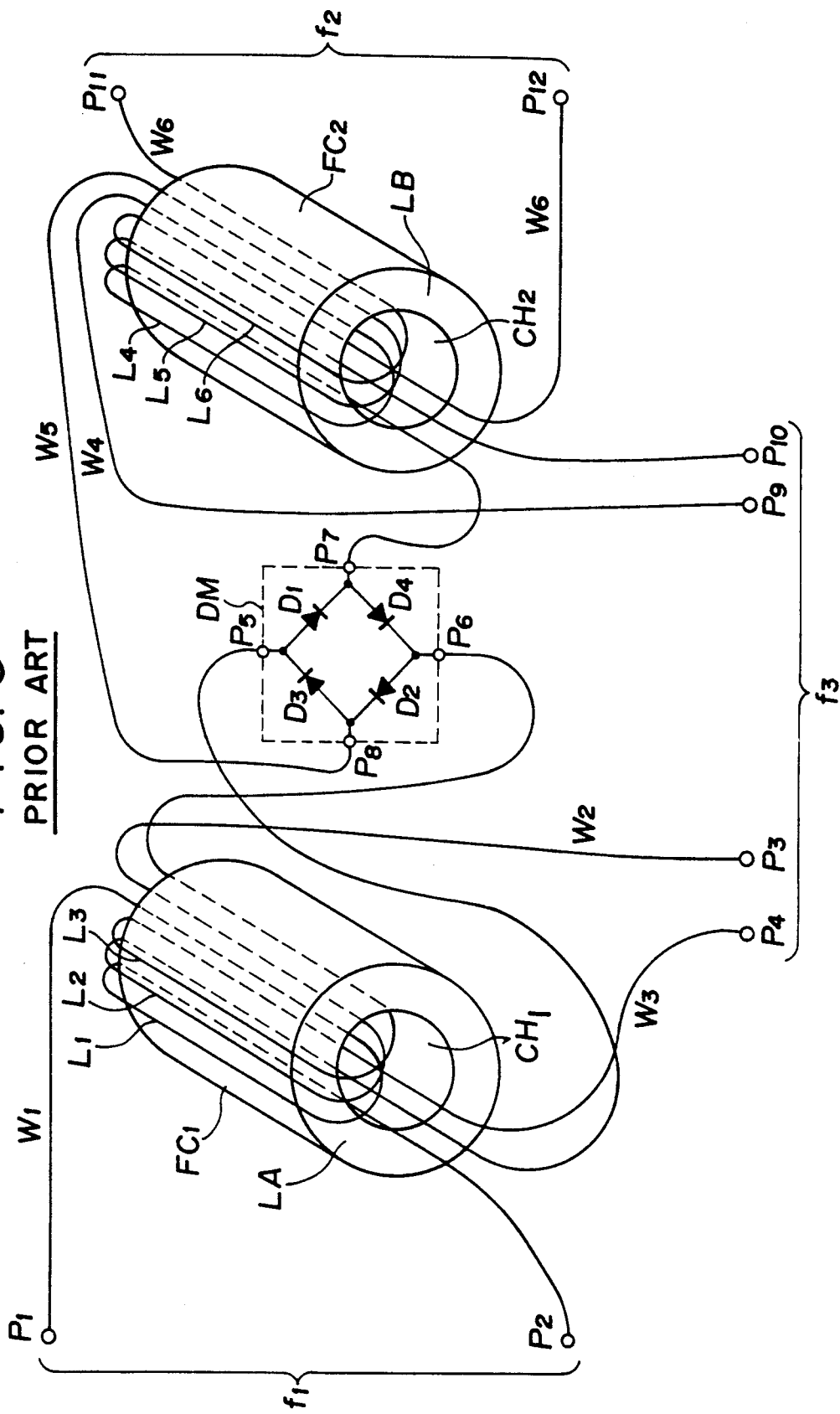
FIG. 9 is a diagram of a prior art double-balanced mixer.

FIG. 8 illustrates pattern processes $PP_0$ to $PP_{11}$ for producing the above mentioned double-balanced mixer having thick film structure.

In operation of the double-balanced mixer having the above structure, if signal $f_1$, having a frequency in the range from 0.9 to 1.1 GHz and an amplitude of $-10$ to $-5$ dBm are input from the silver electrodes $RF_1$, $G_1$ and if $+7$ dBm of local signal $f_2$ is input from the silver electrodes $LO_1$, $G_2$, then there is obtained a flat response characteristic of the intermediate frequency $f_3$. Further suppression of interference caused by the detection of the third modulation generated by two signals is improved 6 dB.

Instead of the adjusting stubs, capacitors of 1 pF to 3 pF may be used to get 3 to 5 dB improved characteristic, in case of some outside circuits.

According to the double-balanced mixer of the present invention, the mismatching of impedance by the outside circuit can be compensated to get a wide usable frequency band width and a stable high frequency characteristic.

What is claimed is:

1. A multi-layered double-balanced mixer comprising:
    a substrate;
    first and second transformers formed as film structures on a surface of said substrate;
    each of said first and second transformers including first, second and third coils formed in respective lower, middle and upper layers, and first and second insulating films separating said lower and middle layers and said middle and upper layers, respectively;
    a diode matrix including four diodes wherein the electrodes of each diode are connected to electrodes of respective adjoining diodes;
    first and second input/output electrode pairs connected to opposite ends of the second coils of the respective transformers;
    said first and third coils of the transformers each having a first end connected to respective diode electrodes of said diode matrix; and
    third input/output electrodes connected to a second end of each of said first and third coils of the first and second transformers.

2. A multi-layered double-balanced mixer as set forth in claim 1 wherein said first and second transformers include respective cores formed by films of ferrite material.

3. A multi-layered double-balanced mixer comprising:
    a substrate;
    first and second transformers formed as film structure on said substrate;
    each of said first and second transformers including first, second and third winding layers;
    a diode matrix including four diodes wherein the electrodes of each diode are connected to electrodes of respective adjoining diodes;
    first and second input/output electrode pairs connected to opposite ends of the second winding layers of the respective transformers;
    said first and third winding layers of the transformers each having a first end connected to a respective diode electrode of said diode matrix;
    third input/output electrodes connected to a second end of each of said first and third winding layers of the first and second transformers;
    circuit shielding means for shielding said first and second transformers and said diode matrix; and
    first and second adjusting stubs formed as film structure outside said circuit shielding means and connected to respective input/output electrodes of said first and second input/output electrodes for adjusting input impedances of the double-balanced mixer.

4. A multi-layered double-balanced mixer as set forth in claim 3, wherein said adjusting stubs are adhered to said circuit shielding means.

5. A multi-layered double-balanced mixer as set forth in claim 3, wherein said substrate comprises alumina and curing agent.

* * * * *